(12) United States Patent  (10) Patent No.: US 9,129,779 B2
Booth et al.  (45) Date of Patent: *Sep. 8, 2015

(54) PROCESSING SYSTEM FOR DETECTING IN-SITU ARCING EVENTS DURING SUBSTRATE PROCESSING

(75) Inventors: Jean-Paul Booth, Essonne (FR); Douglas Keil, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 719 days.

This patent is subject to a terminal disclaimer.

(21) Appl. No.: 13/441,187

(22) Filed: Apr. 6, 2012

(65) Prior Publication Data

US 2012/0259562 A1  Oct. 11, 2012

Related U.S. Application Data

(63) Continuation of application No. 12/498,934, filed on Jul. 7, 2009, now Pat. No. 8,159,233.

(60) Provisional application No. 61/078,731, filed on Jul. 7, 2008.

(51) Int. Cl.
*G01R 27/26* (2006.01)
*H01H 9/50* (2006.01)
(Continued)

(52) U.S. Cl.
CPC .............. *H01J 37/3299* (2013.01); *G01D 5/24* (2013.01); *G01R 27/2605* (2013.01);
(Continued)

(58) Field of Classification Search
CPC ........... H01J 37/32935; H01J 37/3299; H02H 1/0015; H02H 3/44; G01R 27/2605; G01R 31/34; G01R 31/343; G01R 31/1272; G01D 5/24

USPC ........ 324/676, 658, 649, 600, 536; 361/2, 12, 361/14, 134; 219/121.11, 121.36, 121.43, 219/121.59

See application file for complete search history.

(56) References Cited

U.S. PATENT DOCUMENTS 4,595,487 A  6/1986 Nunlist
4,963,713 A  10/1990 Horiuchi et al.
(Continued)

FOREIGN PATENT DOCUMENTS

CN  102084471 A  6/2011
JP  H0364897 A  3/1991
(Continued)

OTHER PUBLICATIONS

"International Preliminary Report on Patentability", Issued in PCT Application No. PCT/US2009/048747; Mailing Date: Jan. 13, 2011.
(Continued)

*Primary Examiner* — Hoai-an D Nguyen

(57) ABSTRACT

A processing system for detecting in-situ arcing events during substrate processing is provided. The processing systems includes at least a plasma processing chamber having a probe arrangement, wherein the probe arrangement is disposed on a surface of the processing chamber and is configured to measure at least one plasma processing parameter. The probe arrangement includes a plasma-facing sensor and a measuring capacitor, wherein the plasma-facing sensor is coupled to a first plate of the measuring capacitor. The probe arrangement also includes a detection arrangement that is coupled to a second plate of the measuring capacitor, wherein the detection arrangement is configured for converting an induced current flowing through the measuring capacitor into a set of digital signals, which is processed to detect the in-situ arcing events.

20 Claims, 14 Drawing Sheets

(51) Int. Cl.
    *B23K 9/00* (2006.01)
    *H01J 37/32* (2006.01)
    *G01R 31/34* (2006.01)
    *G01D 5/24* (2006.01)
    *H02H 1/00* (2006.01)
    *G01R 31/12* (2006.01)
    *H02H 3/44* (2006.01)

(52) U.S. Cl.
    CPC ........ *G01R 31/343* (2013.01); *H01J 37/32935* (2013.01); *H02H 1/0015* (2013.01); *G01R 31/1272* (2013.01); *G01R 31/34* (2013.01); *H02H 3/44* (2013.01)

(56) References Cited

U.S. PATENT DOCUMENTS

| | | |
|---|---|---|
| 4,982,067 A | 1/1991 | Marantz et al. |
| 5,009,738 A | 4/1991 | Gruenwald et al. |
| 5,175,472 A | 12/1992 | Johnson, Jr. et al. |
| 5,473,162 A | 12/1995 | Busch et al. |
| 5,703,488 A | 12/1997 | Ohmi et al. |
| 5,936,413 A | 8/1999 | Booth et al. |
| 6,024,831 A | 2/2000 | Hwang et al. |
| 6,165,311 A | 12/2000 | Collins et al. |
| 6,218,312 B1 | 4/2001 | Collins et al. |
| 6,291,072 B1 | 9/2001 | Kimoto et al. |
| 6,326,794 B1 | 12/2001 | Lundquist et al. |
| 6,440,260 B1 | 8/2002 | Denda et al. |
| 6,447,691 B1 | 9/2002 | Denda et al. |
| 6,833,710 B2 | 12/2004 | Benveniste |
| 6,894,474 B2 | 5/2005 | Cox et al. |
| 6,902,646 B2 | 6/2005 | Mahoney et al. |
| 7,030,335 B2 | 4/2006 | Hoffman et al. |
| 7,067,432 B2 | 6/2006 | Xu et al. |
| 7,093,560 B2 | 8/2006 | Tong et al. |
| 7,334,477 B1 | 2/2008 | Pirkle |
| 7,374,636 B2 | 5/2008 | Horioka et al. |
| 7,413,672 B1 | 8/2008 | Keil et al. |
| 7,479,207 B2 | 1/2009 | Kimball et al. |
| 7,640,120 B2 | 12/2009 | Axenbeck et al. |
| 7,994,794 B2 | 8/2011 | Kimball et al. |
| 8,159,233 B2 * | 4/2012 | Booth et al. ................ 324/676 |
| 8,179,152 B2 * | 5/2012 | Booth et al. ................ 324/713 |
| 8,217,299 B2 * | 7/2012 | Ilic et al. ................ 219/121.57 |
| 2001/0025691 A1 | 10/2001 | Kanno et al. |
| 2002/0011213 A1 | 1/2002 | Ramiah et al. |
| 2002/0024338 A1 | 2/2002 | Saho et al. |
| 2002/0139478 A1 | 10/2002 | Ma et al. |
| 2003/0038114 A1 | 2/2003 | Howald |
| 2003/0210510 A1 | 11/2003 | Hann et al. |
| 2004/0004708 A1 | 1/2004 | Willis |
| 2004/0107906 A1 | 6/2004 | Collins et al. |
| 2005/0032253 A1 | 2/2005 | Hsu et al. |
| 2005/0103439 A1 | 5/2005 | Goodman |
| 2005/0194094 A1 | 9/2005 | Yasaka |
| 2005/0211384 A1 | 9/2005 | Hayashi |
| 2005/0212450 A1 | 9/2005 | Martinez et al. |
| 2006/0021970 A1 | 2/2006 | Parsons |
| 2006/0150913 A1 | 7/2006 | Wang et al. |
| 2006/0249729 A1 | 11/2006 | Mundt et al. |
| 2007/0080138 A1 | 4/2007 | Hoffman et al. |
| 2007/0162172 A1 | 7/2007 | Tanaka et al. |
| 2007/0215285 A1 | 9/2007 | Kimball et al. |
| 2008/0066861 A1 | 3/2008 | Kimball et al. |
| 2009/0007642 A1 | 1/2009 | Busby et al. |
| 2009/0322342 A1 | 12/2009 | Keil |
| 2010/0006417 A1 | 1/2010 | Booth et al. |
| 2010/0007337 A1 | 1/2010 | Booth et al. |
| 2010/0007359 A1 | 1/2010 | Booth et al. |
| 2010/0007362 A1 | 1/2010 | Booth et al. |
| 2010/0008015 A1 | 1/2010 | Booth et al. |
| 2010/0033195 A1 | 2/2010 | Booth et al. |

FOREIGN PATENT DOCUMENTS

| | | |
|---|---|---|
| JP | 2000-268993 | 9/2000 |
| JP | 2001144071 A | 5/2001 |
| JP | 2002063999 A | 2/2002 |
| JP | 2003-318115 | 11/2003 |
| JP | 2007037817 A | 2/2007 |
| JP | 2008-016517 A | 1/2008 |
| KR | 10-0378187 B1 | 3/2003 |
| KR | 10-2004-0024720 A | 3/2004 |
| KR | 10-2007-0035346 A | 6/2006 |
| KR | 10-2007-0035346 A | 3/2007 |
| TW | 589659 B | 6/2004 |
| TW | 1326462 B | 6/2010 |
| WO | WO-9711587 A1 | 3/1997 |
| WO | WO2007/145801 A2 | 12/2007 |
| WO | WO-2008002938 A2 | 1/2008 |

OTHER PUBLICATIONS

"International Preliminary Report on Patentability", Issued in PCT Application No. PCT/US2009/049756; Mailing Date: Jan. 20, 2011.
"International Preliminary Report on Patentability", Issued in PCT Application No. PCT/US2009/049757; Mailing Date: Jan. 20, 2011.
"International Preliminary Report on Patentability", Issued in PCT Application No. PCT/US2009/049759; Mailing Date: Jan. 20, 2011.
"International Preliminary Report on Patentability", Issued in PCT Application No. PCT/US2009/049760; Mailing Date: Jan. 20, 2011.
"International Preliminary Report on Patentability", Issued in PCT Application No. PCT/US2009/049761; Mailing Date: Jan. 20, 2011.
"International Search Report", Issued in PCT Application No. PCT/US2009/049757; Mailing Date: Feb. 23, 2010.
"International Search Report", Issued in PCT Application No. PCT/US2009/049760; Mailing Date: Feb. 23, 2010.
"International Search Report", Issued in PCT Application No. PCT/US2009/049759; Mailing Date: Feb. 3, 2010.
"International Search Report", Issued in PCT Application No. PCT/US2009/049762; Mailing Date: Feb. 24, 2010.
"International Search Report", Issued in PCT Application No. PCT/US2009/049756; Mailing Date: Mar. 2, 2010.
"International Search Report", Issued in PCT Application No. PCT/US2009/049761; Mailing Date: Feb. 24, 2010.
"International Search Report", Issued in PCT Application No. PCT/US2009/048747; Mailing Date: Feb. 11, 2010.
"Non Final Office Action", U.S. Appl. No. 12/477,007, Mailing Date: Aug. 23, 2011.
"Non Final Office Action", U.S. Appl. No. 12/498,939, Mailing Date: Oct. 20, 2011.
"Written Opinion", Issued in PCT Application No. PCT/US2009/048747; Mailing Date: Feb. 11, 2010.
"Written Opinion", Issued in PCT Application No. PCT/US2009/049757; Mailing Date: Feb. 23, 2010.
"Written Opinion", Issued in PCT Application No. PCT/US2009/049759; Mailing Date: Feb. 3, 2010.
"Written Opinion", Issued in PCT Application No. PCT/US2009/049756; Mailing Date: Mar. 2, 2010.
"Written Opinion", Issued in PCT Application No. PCT/US2009/049760; Mailing Date: Feb. 23, 2010.
"Written Opinion", Issued in PCT Application No. PCT/US2009/049762; Mailing Date: Feb. 24, 2010.
"Written Opinion", Issued in PCT Application No. PCT/US2009/049761; Mailing Date: Feb. 24, 2010.
Japan Office Action dated Jan. 14, 2014; for Japanese Application No. 2011-517509; International Filing Date: Jul. 7, 2009; 13 Pages.
"Final Office Action", U.S. Appl. No. 12/498,939, Mailing Date Mar. 15, 2012.
"Final Office Action", U.S. Appl. No. 12/498,940, Mailing Date Apr. 23, 2012.
"International Preliminary Report on Patenability", Issued in PCT Application No. PCT/US2009/049762; Mailing Date Jan. 20, 2011.
"Non Final Office Action", U.S. Appl. No. 12/498,939, Mailing Date Oct. 9, 2012.
"Non Final Office Action", U.S. Appl. No. 12/498,940, Mailing Date Oct. 16, 2012.

(56) References Cited

OTHER PUBLICATIONS

"Non Final Office Action", U.S. Appl. No. 12/498,940, Mailing Date Dec. 7, 2011.
"Notice of Allowance", U.S. Appl. No. 12/498,934, Mailing Date Nov. 28, 2011.
Singapore Search Report mailed Jun. 13, 2014 for Sinagpore Application No. 201306063-7; 8 Pages.
Notification of Examination Opinions for TW98122911 dated Apr. 2, 2015; 5 pages.

* cited by examiner

PROCESSING SYSTEM FOR DETECTING IN-SITU ARCING EVENTS DURING SUBSTRATE PROCESSING

PRIORITY CLAIM

This continuation application claims priority under 37 CFR 1.53(b) of and claims the benefit under 35 U.S.C. §120 to a commonly assigned patent application entitled "PASSIVE CAPACITIVELY-COUPLED ELECTROSTATIC (CCE) PROBE ARRANGEMENT FOR DETECTING IN-SITU ARCING EVENTS IN A PLASA PROCESSING CHAMBER", application Ser. No. 12/498,934 filed on Jul. 7, 2009, which claims priority under 35 U.S.C. §119(e) to a commonly assigned provisional patent application entitled "Passive Capacitively-Coupled Electrostatic (CCE) Probe Arrangement For Detecting In-Situ Arcing Events in a Plasma Processing Chamber," by Booth et al., Application Ser. No. 61/078,731, filed on Jul. 7, 2008, which is incorporated by reference herein.

BACKGROUND OF THE INVENTION

During the processing of a substrate in the plasma processing chamber, satisfactory results often require tight control of the process parameters. This is particularly true for processes such as deposition, etching, cleaning, etc., that are employed to manufacture modern high density integrated circuits. When the processing parameters (such as bias voltage, RF power, ion flux, plasma density, pressure, etc.) exceed a narrow, pre-defined window, a process excursion is said to have occurred. These process excursions represent undesirable events that often lead to undesirable processing results (e.g., poor etch profile, low selectivity, etc.). Accordingly, the detection, characterization, and avoidance of process excursions are important tasks for process engineers in the manufacture of integrated circuits.

Detecting process excursions is often performed via monitoring of various process parameters. Some process parameters (such as bias voltage, reflected power, etc.) may be measured directly while others may be inferred from measured parameters.

In-situ arcing is a type of process excursion that has the potential to decrease yield, damage the substrate and/or damage the chamber components. Arcing can occur between features on a substrate, between the substrate and its surrounding components such as the grounded chamber components, and between chamber components, for example. There can be many causes for arcing. Irrespective, arcing represents an uncontrolled event that is almost always undesirable and/or has the potential to create undesirable damage and/or undesirable process results.

Accordingly, the detection of in-situ arcing is important for the purpose of diagnostic and recipe adjustment in order to improve process results and process yield, as well as to avoid damage to the substrate and/or the chamber components.

BRIEF SUMMARY OF THE INVENTION

The invention relates, in an embodiment, to an arrangement for detecting in-situ arcing events within a processing chamber of a plasma processing system during substrate processing. The arrangement includes a probe arrangement, which is disposed on a surface of the processing chamber and is configured to measure at least one plasma processing parameter. The probe arrangement includes a plasma-facing sensor and a measuring capacitor, wherein the plasma-facing sensor is coupled to a first plate of the measuring capacitor. The probe arrangement also includes a detection arrangement that is coupled to a second plate of the measuring capacitor, wherein the detection arrangement is configured for converting an induced current flowing through the measuring capacitor into a set of digital signals, which is processed to detect the in-situ arcing events.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
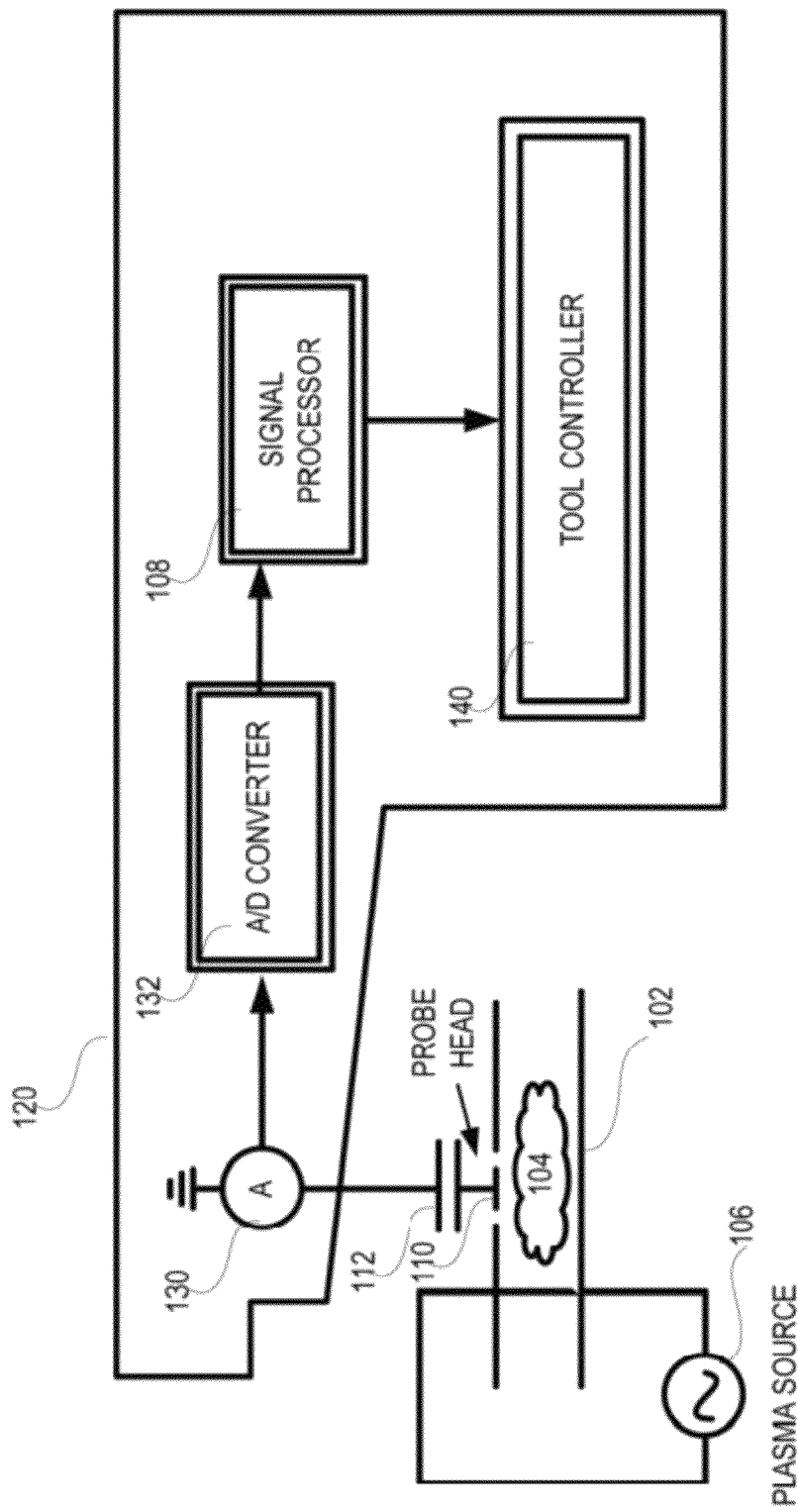
FIG. 1 shows, in accordance with an embodiment of the present invention, an in-situ arcing event detection arrangement employing a passive CCE probe architecture.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Embodiments of the invention relate to the use of a capacitively-coupled electrostatic (CCE) probe arrangement or a subset thereof to detect in-situ arcing events. By way of background, CCE probes have long been employed to measure plasma processing parameters such as ion flux, electron temperature, floating potential, thin film thickness, etc. CCE probes are known in the art, and details may be obtained from publicly available literature, including for example U.S. Pat. No. 5,936,413 entitled "Method And Device For Measuring An Ion Flow In A Plasma" (Aug. 10, 1999), which is incorporated herein by reference. CCE probes offer many advantages, including for example improved detection sensitivity, minimal perturbation to the plasma due to the small size of the sensor, ease of mounting on the chamber wall, insensitivity to polymer deposition on the sensor head, etc. Furthermore, the plasma-facing surface of the sensor can often be made of the same material as that of the surrounding chamber wall, thereby further minimizing perturbation to the plasma. These advantages make CCE probes highly desirable for use in sensing process parameters.

Generally speaking, a CCE probe arrangement involves a plasma-facing sensor connected to one plate of a measuring capacitor. The other plate of the measuring capacitor is coupled to an RF voltage source. The RF voltage source periodically supplies RF oscillation trains, and measurements are performed across the measuring capacitor to determine the rate of capacitor current discharge immediately following the end of each RF oscillation train. Details pertaining to the CCE probe arrangement and CCE probe operation are discussed in the aforementioned U.S. Pat. No. 5,936,413 and will not be further discussed herein.

However, CCE probes have, up to now, been employed to measure parameters such as ion flux, electron temperature, floating potential measurements, etc. Furthermore, CCE probes traditionally perform measurements by charging up the measuring capacitor with the RF voltage source and measuring the capacitor decay current in between RF oscillation trains. There has not been an attempt, up to now, of adapting the CCE probe arrangement or a subset thereof to measure in-situ arcing events.

In accordance with one or more embodiments of the present invention, an innovative passive CCE probe arrangement is proposed to enable the detection of in-situ arcing event. Although the CCE probe arrangement in accordance with embodiments of the invention is passive, examples and discussions will be provided herein to enable in-situ arcing event detection even if the CCE arrangement is actively excited by an external RF voltage source (as was done in the prior art to measure the decay current across the measuring capacitor in between oscillation trains). Thus, in one or more embodiments, the measurement is performed passively in that the measuring capacitor is not required to be charged up using an external RF voltage source as was done in traditional CCE probe arrangements.

It is realized by the inventors herein that when the probe surface is at floating potential, the net current between the probe and the plasma is zero. In other words, although there may be fluxes of electrons and positive ions to the probe from the plasma, the net charge exchanged between the probe head and the plasma is zero, resulting in a zero net current. However, if the potential difference between the probe head and the plasma changes, the current equilibrium is momentarily disturbed, resulting in a momentary non-zero induced current that flows through the measuring capacitor. The potential difference between the probe head and the plasma may change if, for example, the potential of the plasma is changed. An in-situ arcing event is such an event that has the capability of changing the plasma potential. By detecting this momentary non-zero induced current through the measuring capacitor, in-situ arcing events may be detected.

The inventors herein also realized that it is possible to eliminate the need for the RF excitation source of the traditional CCE probe architecture in the detection of in-situ arcing events. Instead, monitoring may be performed passively by monitoring the induced current through the measuring capacitor, which induced current is created by the in-situ arcing event. In this manner, the architecture of the passive CCE probe may differ and may be much simpler than the prior art CCE probe architecture.

Furthermore, the detection algorithm and strategies may also be different in terms of pattern detection and timing. In general terms, the detection algorithm looks for high frequency perturbations (i.e., fast changes) in the current that flows through the measuring capacitor. These high frequency perturbations tend to be in the kHz to MHz range, for example. In contrast, the measuring capacitor current decays slowly over a slower time scale, for example 0.1 to tens of milliseconds. Alternatively or additionally, the voltage of the probe head may also be detected, also in a passive manner (i.e., without requiring external RF excitation). An in-situ arcing event will cause fast transients in the probe voltage, which may be detected as spikes (in the microsecond to the millisecond timescale, for example) in the probe voltage. These voltage spikes may provide additional information about the in-situ arcing events, in one or more embodiments.

The features and advantages of embodiments of the present invention may be better understood with reference to the figures and discussions that follow. FIG. 1 shows, in accordance with an embodiment of the present invention, an in-situ arcing event detection arrangement employing a passive CCE probe architecture. Chamber 102 is conventional and is employed to generate a plasma 104 therein for substrate processing purposes. In the example of FIG. 1, plasma 104 is generated and sustained by an RF source 106 (which is not employed to excite the CCE probe arrangement in the example of FIG. 1). A probe head 110 is disposed in the upper electrode although probe head 110 may also be disposed elsewhere on the chamber wall. Probe head 110 may represent a conventional CCE probe head, for example. Probe head 110 is connected in series with one plate of a measuring capacitor 112. The other plate of measuring capacitor 112 is coupled to a detection arrangement 120.

As mentioned, a probe head made of a conductive material is installed in a surface of the chamber. A short RF train is applied to the probe, causing the capacitor (Cm) to charge up and the surface of the probe to acquire a negative potential (several tens of volts negative with respect to ground). Following the end of the RF pulse, the potential of the probe decays back to the floating potential as Cm discharges. The rate at which the potential changes is determined by the plasma characteristics. During this discharge, the potential of the probe Vf is measured with a voltage measurement device, and the current following to the probe and through capacitor Cm is measured with a current measurement device. The curves V(t) and I(t) are used to construct a current-voltage characteristic, VI, which is then analyzed by a signal processor. A model function is fitted to these data points, producing estimates of the floating potential Vf, ion saturation current Isat and electron temperature Te. Further details may be found in a co-pending application entitled "Methods for Automatically Characterizing a Plasma", filed Jun. 26, 2008 in the US Patent Office (Application No. 61/075,948) and filed Jun. 2, 2009 in the US Patent Office (application Ser. No. 12/477, 007), which is included in the DISCUSSION herein.

In the example of FIG. 1, detection arrangement 120 is configured to convert the induced current flowing through measuring capacitor 112 into a digital signal for analysis. Thus, there is a current-to-voltage converter 130, which is configured for converting the induced current flowing through measuring capacitor 112 into an analog voltage. An analog-to-digital converter 132 converts the analog voltage signal from current-to-voltage converter 130 into a digital signal, which is then provided to a signal processor 108. Signal processor 108 may represent the hardware and/or software employed to perform signal processing on the digital signal to detect the high frequency perturbations characteristics of in-situ arcing events.

The exact perturbations may vary from chamber to chamber and may vary depending on arcing event types. Irrespective, these perturbations tend to be high in frequency and tend to have amplitude excursions in both the positive and negative directions, representing the momentarily change in the induced current in one direction and the subsequent attainment of equilibrium after swinging in the other direction. By detecting the high frequency perturbation patterns, in-situ arcing events may be detected. The detection of the in-situ arcing events may then be furnished to a tool control circuit 140 to facilitate corrective actions, including for example changing process parameters and/or shutting down the plasma processing system to prevent further damage.

Figure 2:
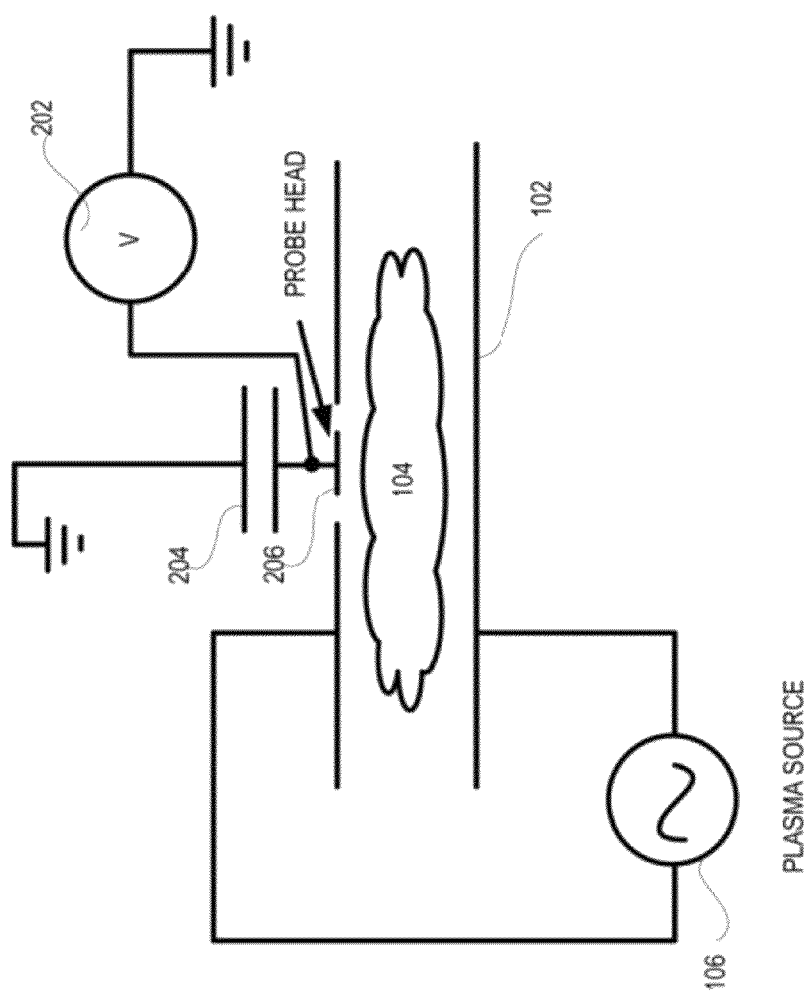
FIG. 2 shows, in accordance with an embodiment of the present invention, an in-situ arcing event detection arrangement employing a passive CCE probe architecture wherein a voltage measurement device is employed.

Alternatively or additionally, as shown in FIG. 2, a voltage measurement device 202 may be coupled to the plate 204 of the measuring capacitor that is also coupled to the probe head 206. The voltage measurement device 202 is employed to detect perturbations in the potential of the probe head. Again, the voltage measurement may be analyzed for high frequency perturbation patterns representative of in-situ arcing events. If desired, the voltage measurements may be converted to a digital signal for signal processing purposes in order to detect, using digital analysis techniques, the high frequency perturbations in the probe voltage.

Alternatively or additionally, a transformer may be coupled to the plate of the capacitor that is not coupled to the probe head to facilitate the detection of the perturbation in the current that flows through the measuring capacitor. One skilled in the art will readily appreciate that other techniques for detecting high frequency transients in the current signal or voltage signal also exist and may well be employed to facilitate the detection of in-situ arcing events.

In one or more embodiments, the rate of change of the current or voltage signal is analyzed. For example, if the rate of change exceeds a certain threshold (e.g., greater than 0.5 mA between two adjacent samples taken at 20 microseconds intervals), an in-situ arcing event is deemed to have happened. A simple algorithm looking at purely the rate of change would negate the need to store voluminous current and/or voltage sample data and may be advantageous in some systems that seek to detect in-situ arcing events.

Note that since the in-situ arcing event detection depends on the detection of the high frequency perturbation, it is possible to implement a dual-function CCE probe whereby the measuring capacitor is also charged by the periodic RF pulse trains as is done in conventional CCE probe arrangements. Since the arc detection algorithm is designed to detect high frequency perturbations and/or rate of change exceeding a certain threshold, it is possible to perform this detection on the measuring capacitor's current decay signal. It is also possible to perform this detection (on either the induced current or the potential of the probe head) in the time period between adjacent excitation RF oscillation trains when the probe head is at a relatively steady floating potential. As can be appreciated by one skilled in the art from the foregoing discussion, the detection in the induced current signal or the voltage signal of high frequency perturbations or of a high rate of change characteristic of in-situ arcing events may be performed with or without the external RF excitation of the measuring capacitor.

Figure 3:
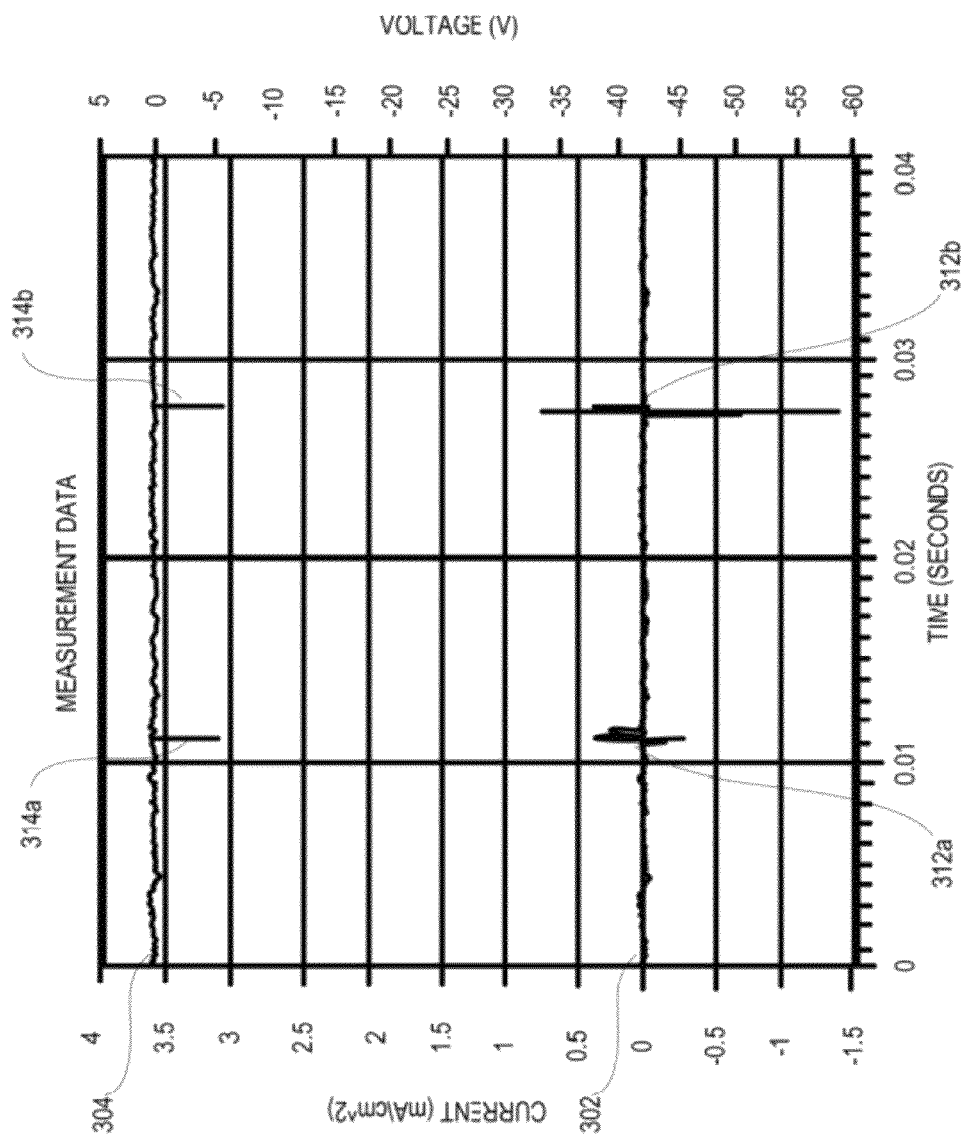
FIG. 3 shows, in accordance with an embodiment of the invention, a plot of the high frequency perturbations indicative of small in-situ arcing events.

FIG. 3 shows, in accordance with an embodiment of the invention, a plot of the high frequency perturbations indicative of small in-situ arcing events. Trace 302 tracks the induced current through the measuring capacitor while trace 304 tracks the probe potential voltage. Current trace 302 shows two transients 312a and 312b, representing two in-situ arcing events. The same two in-situ arcing events are also seen in voltage trace 304 (as transients 314a and 314b).

Note that the amplitude excursion in the current trace 302 is substantially more pronounced than the amplitude excursion in the voltage trace 304 for the same in-situ arcing event in the example of FIG. 3. In this case, the current signal is deemed more sensitive to in-situ arcing events and may be used to advantage to detect the same.

Figure 4:
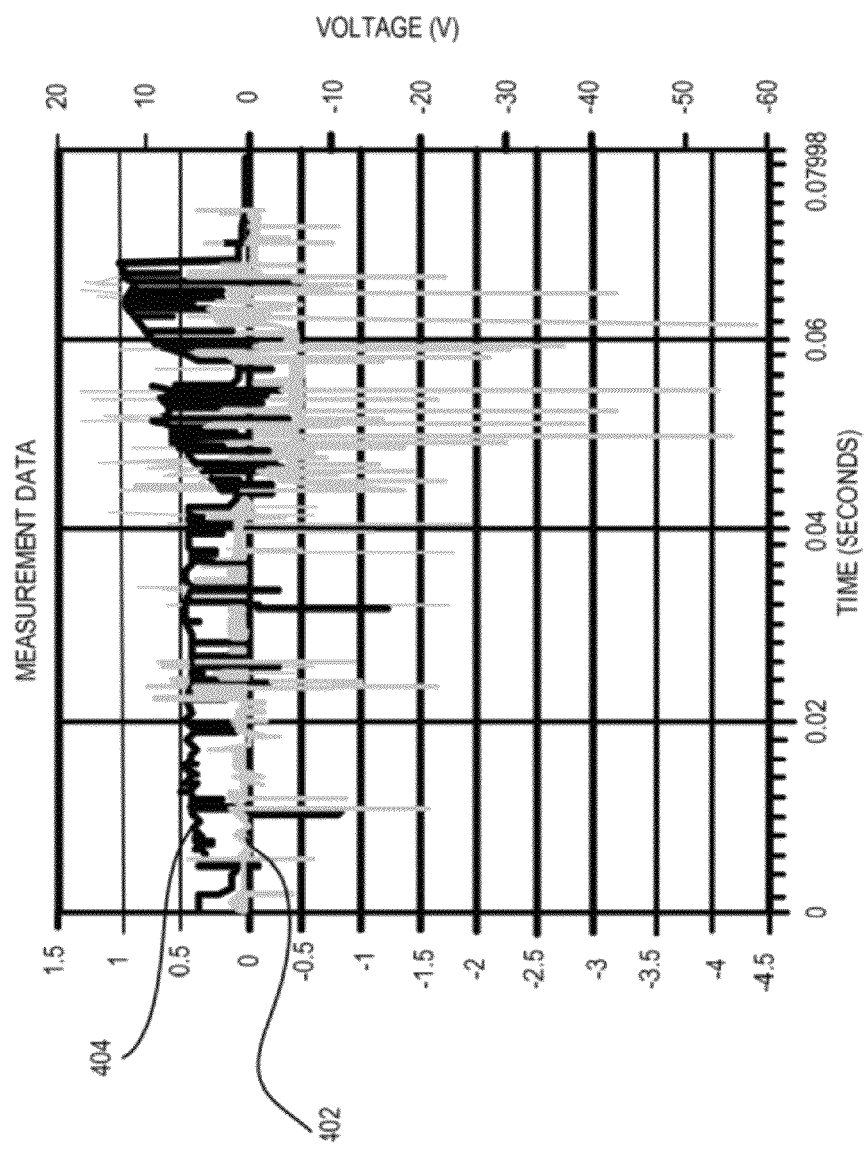
FIG. 4 shows, in accordance with an embodiment of the invention, another plot of the high frequency perturbations indicative of large in-situ arcing events.

FIG. 4 shows, in accordance with an embodiment of the invention, a plot of the high frequency perturbations indicative of large in-situ arcing events. In the example of FIG. 4, a significant number of in-situ arcing events is observed in both the current trace 402 and the voltage trace 404. Again, the amplitude excursions occur in both the negative and the positive directions for each of current trace 402 and voltage trace 404.

An interesting observation is made by the inventors herein and relates to the major in-situ arcing events. Some major in-situ arcing events (such as shown in FIG. 4) are often preceded by smaller, isolated in-situ arcing events (such as shown in FIG. 3). The smaller in-situ arcing events are more difficult to detect but they do serve, if detected in time, as precursors or warnings for the major in-situ arcing events. If the smaller in-situ arcing events (such as shown in FIG. 3) can be detected, parameter changes may be introduced to reduce/eliminate in-situ arcing or the system may be shut down prior to the occurrence of a more damaging major in-situ arcing event. The use of the inventive passive CCE probe-based in-situ arcing detection enables the detection of these small in-situ arcing events and is a major advantage of embodiments of the present invention.

In contrast to prior art arcing detection techniques, such as measuring the voltage and/or forward RF power and/or reflected RF power on the ESC chuck, the inventive passive CCE probe-based in-situ arcing detection technique is highly sensitive. Additionally, there is minimal perturbation to the plasma since the CCE probe head tends to be small, to be installed flushed with the surrounding plasma-facing structures of the plasma processing chamber, and may have a plasma-facing probe surface formed of the same material as that of the plasma-facing components of the chamber. Furthermore, the inventive passive CCE probe-based in-situ arcing detection technique is insensitive to polymer deposition on the plasma-facing probe head since the current is capacitively coupled through any deposition that may be formed on the plasma.

The DISCUSSION is also found in a co-pending application entitled "Methods for Automatically Characterizing a Plasma", filed Jun. 26, 2008 in the US Patent Office (Application No. 61/075,948) and filed Jun. 2, 2009 in the US Patent Office (application Ser. No. 12/477,007) and are incorporated by reference herein.

Discussion of Methods for Automatically Characterizing a Plasma

Advances in plasma processing have provided for growth in the semiconductor industry. To supply chips for a typical electronic product, hundreds or thousands of substrates (such as semiconductor wafers) may be processed. In order for the manufacturing company to be competitive, the manufacturing company needs to be able to process the substrates into quality semiconductor devices with minimal processing time.

Typically, during plasma processing, problems may arise that may cause the substrates to be negatively impacted. One important factor that may alter the quality of the substrate being processed is the plasma itself. In order to have sufficient data to analyze the plasma, sensors may be employed to collect processing data about each substrate. The data collected may be analyzed in order to determine the cause of the problems.

Figure 5:
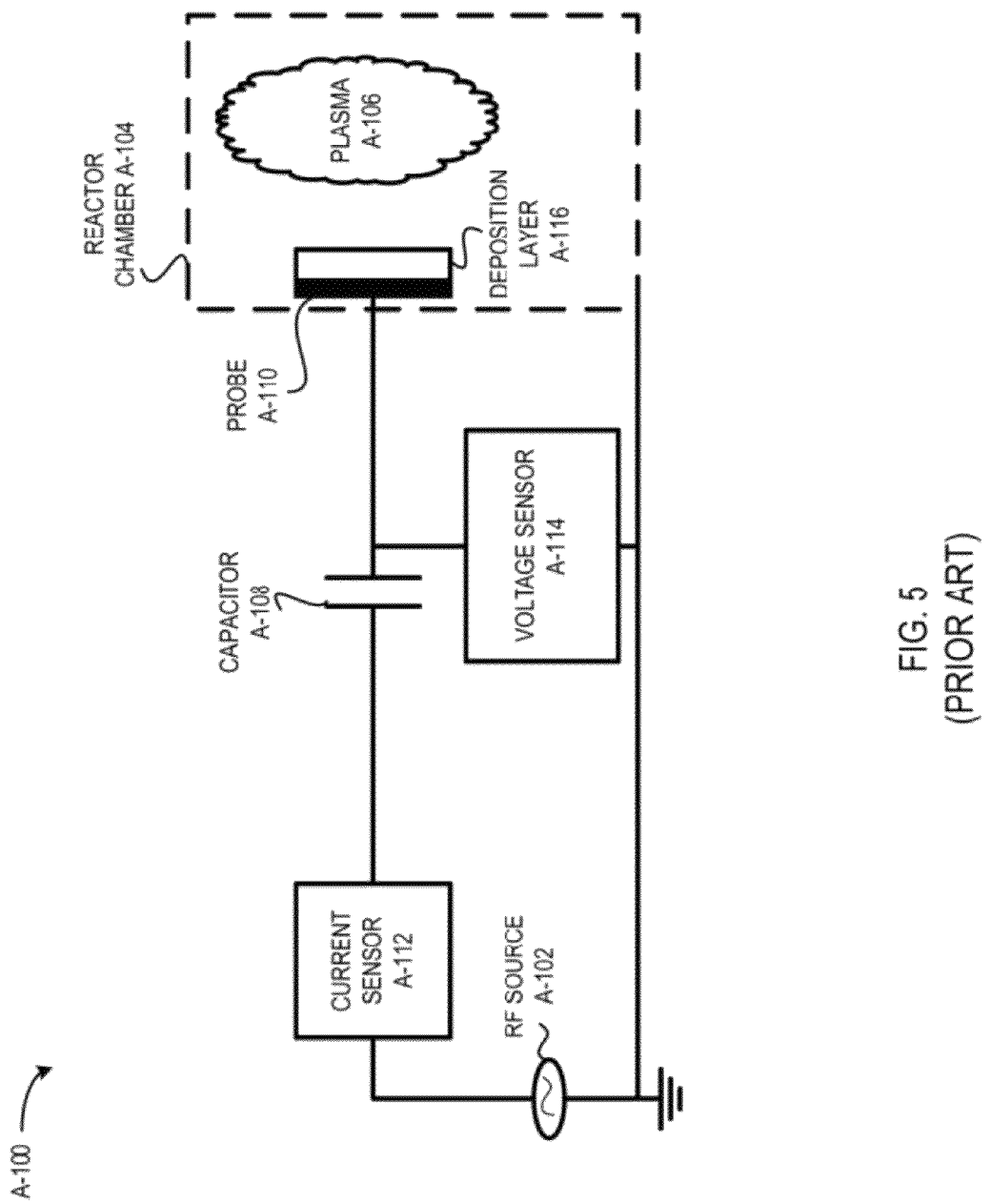
FIG. 5 of the DISCUSSION shows a simple schematic diagram of a portion of a plasma system with a radio frequency (RF) source capacitively-coupled to a reactor chamber to produce plasma.
Figure 7:
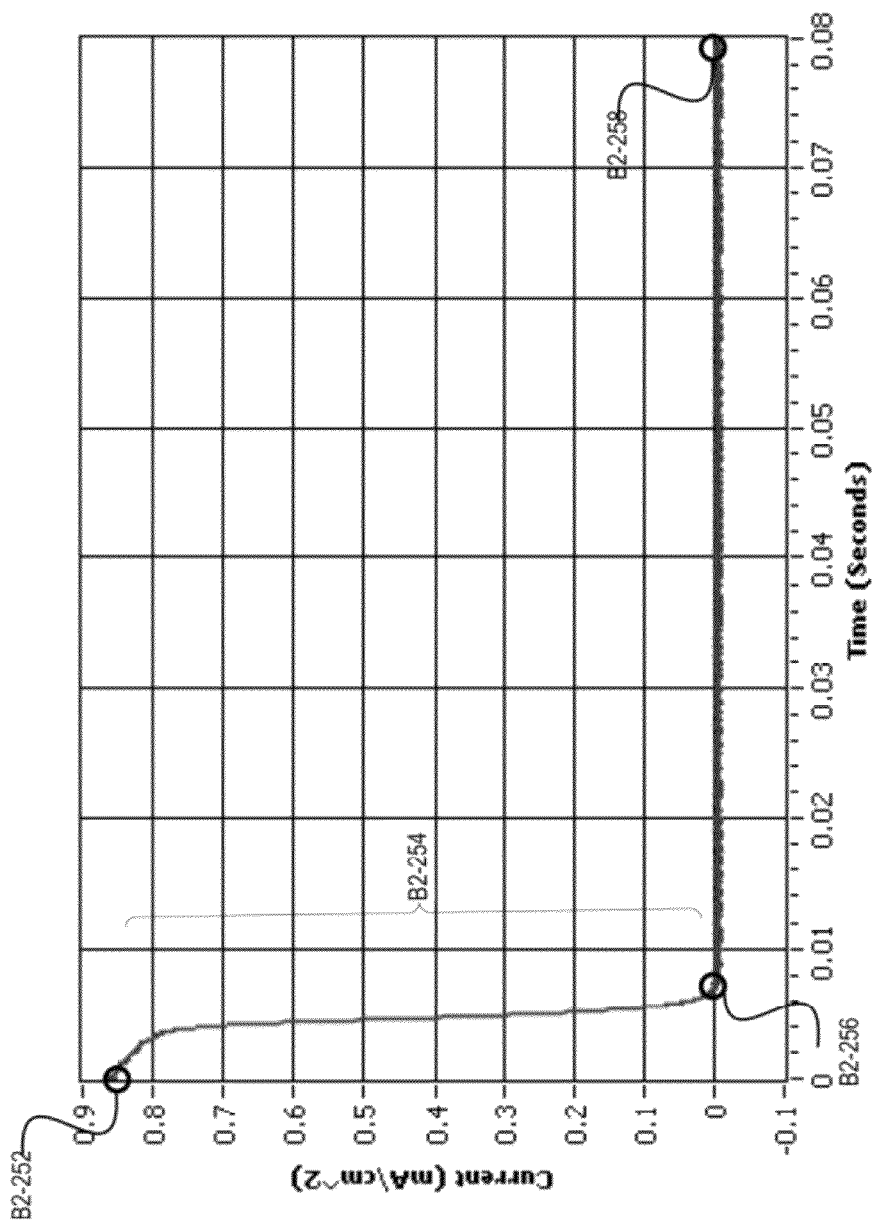
FIG. 7 of the DISCUSSION shows a graph of current data collected after a RF charge.
Figure 8:
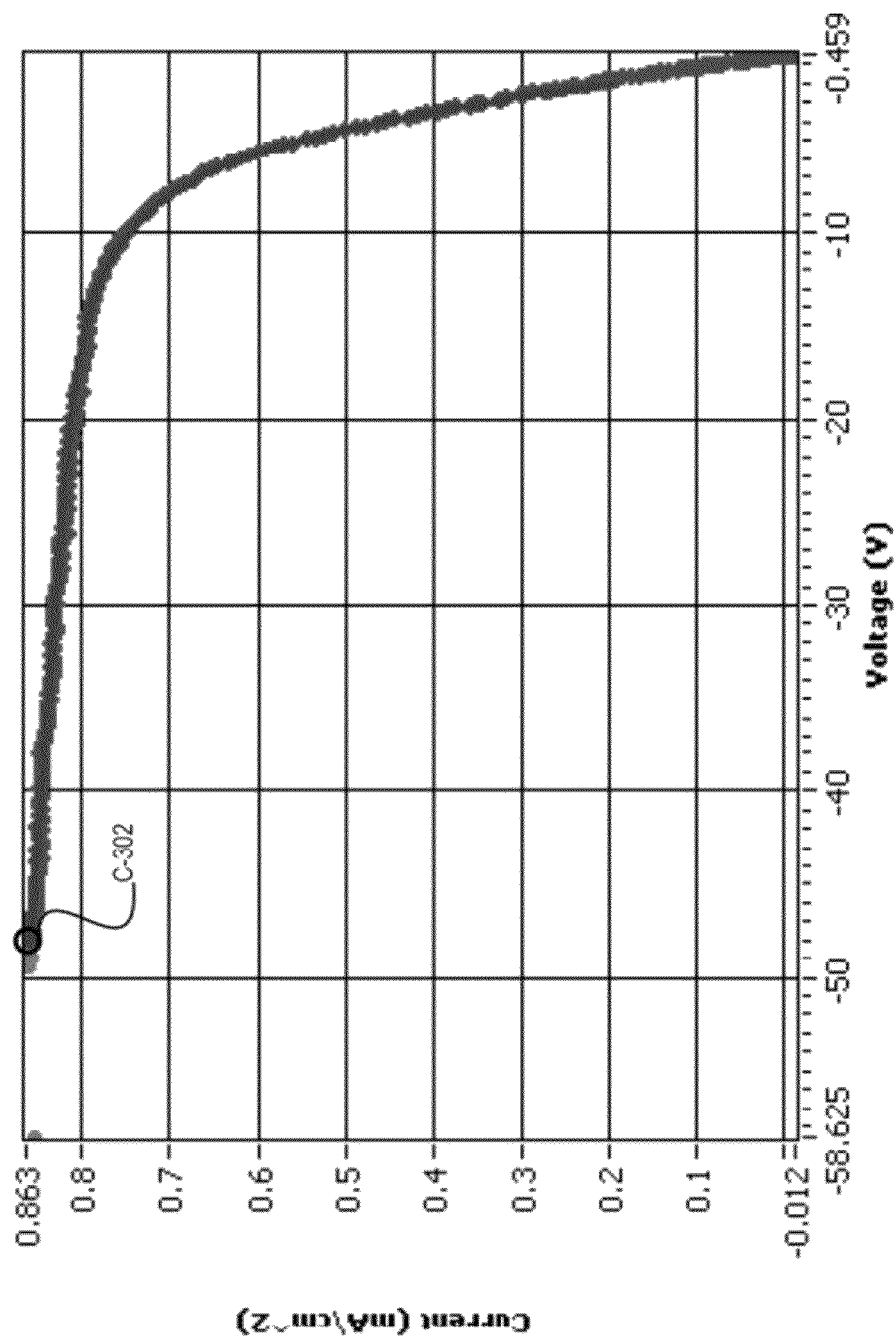
FIG. 8 of the DISCUSSION shows a simple current versus voltage graph for a single time interval between a RF burst.

To facilitate discussion, FIG. 5 shows a simple schematic diagram of a data collecting probe in a portion of a plasma system A-100. Plasma system A-100 may include a radio frequency (RF) source A-102, such as a pulsating RF frequency generator, capacitively-coupled to a reactor chamber A-104 to produce plasma A-106. When RF source A-102 is turn on, a bias voltage is developed across an external capacitor A-108, which may be about 26.2 nanofarads (nF). In an example, RF source A-102 may provide a small burst of power (e.g., 11.5 megahertz) every few milliseconds (e.g., about five milliseconds) causing external capacitor A-108 to be charged. When RF source A-102 is turned off, a bias voltage remains on external capacitor A-108 with a polarity such that probe A-110 is biased to collect ions. As the bias voltage decays, the curves as shown in FIGS. 6, 7 and 8 may be traced.

Those skilled in the art are aware that probe A-110 is usually an electrical probe with a conducting planar surface that may be positioned against the wall of reactor chamber A-104. Probe A-110 is thus directly exposed to reactor chamber A-104 environment. Current and voltage data collected by probe A-110 may be analyzed. Since certain recipe may cause a non-conducting deposition layer A-116 to be deposited on probe A-110, not all probes may be able to collect reliable measurements. However, those skilled in the art are aware that a PIF (planar ion flux) probe enables data to be collected despite the non-conducting deposition layer since the PIF probe scheme is not required to draw a direct current (DC) to implement a measurement.

The current and voltage signal in plasma system A-100 is measured by other sensors. In example, when RF source A-102 is switched off, current sensor A-112 and a high impedance voltage sensor A-114, are employed to measure the current and the voltage, respectively. The measurement data collected from current sensor A-112 and voltage sensor A-114 may then be plotted to create a current graph and a voltage graph. The data may be manually plotted or the data may be entered into a software program to create the graphs.

Figure 6:
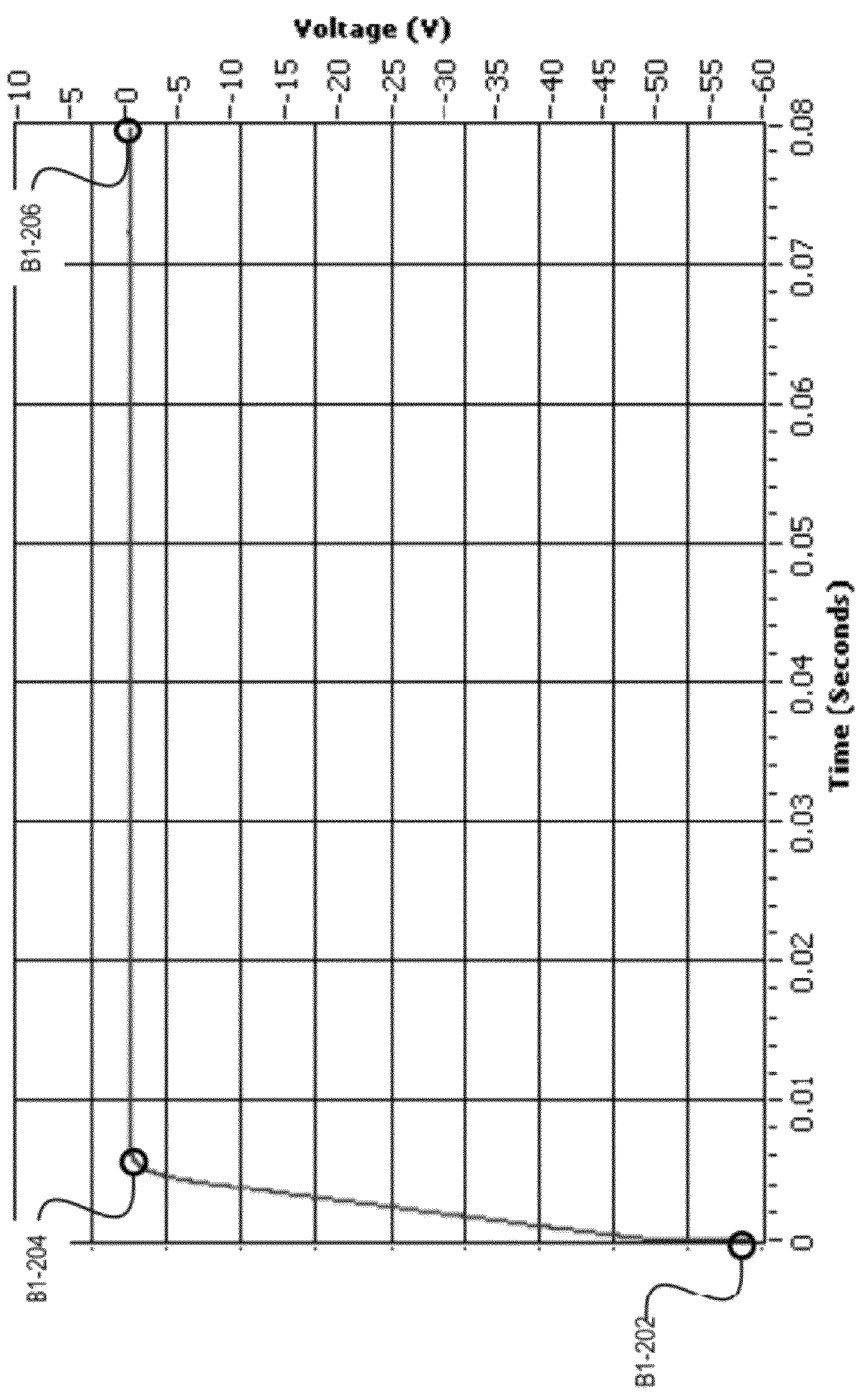
FIG. 6 of the DISCUSSION shows a graph of voltage versus time after a RF charge.

FIG. 6 shows a graph of voltage versus time after a RF charge cycle. At data point B1-202, RF source A-102 has been switched off after an RF charge has been provided (i.e., RF burst). In this example, at data point B1-202, the voltage across probe A-110 is about negative 57 volts. As plasma system A-100 returns to a rest state (interval between data points B1-204 and B1-206), the voltage usually reaches a floating voltage potential. In this example, the floating voltage potential rises from about negative 57 volts to about zero volt. However, the floating voltage potential does not have to be zero and may be a negative or a positive bias voltage potential.

Similarly, FIG. 7 shows a graph of current data collected after a RF charge. At data point B2-252, RF source A-102 has been switched off after an RF charge has been provided. During a decay period B2-254, the return current at external capacitor A-108 may be discharged. In an example, at full charge (data point B2-252), the current is about 0.86 mA/cm$^2$. However, when the current is fully discharged (data point B2-256), the current has returned to zero. Based on the graph, the discharge takes about 75 milliseconds. From data point B2-256 to data point B2-258, the capacitor remains discharged.

Since both the current data and the voltage data are collected over a period of time, a current versus voltage graph may be generated by coordinating the time in order to eliminate the time variable. In other words, the current data collected may be matched against the voltage data collected. FIG. 8 shows a simple current versus voltage graph for a single time interval between a RF burst. At data point C-302, RF source A-102 has been switched off after an RF charge has been provided.

By applying a non-linear fit to the data collected during each RF burst, plasma A-106 may be characterized. In other words, parameters (e.g., ion saturation, ion saturation slope, electron temperature, floating voltage potential, and the like) that may characterize plasma A-106 may be determined. Although plasma A-106 may be characterized with the data collected, the process of calculating the parameters is a tedious manual process that requires human intervention. In an example, when the data has been collected after each RF burst (i.e., when the RF charge has been provided and then turned off), the data may be fed into a software analysis program. The software analysis program may perform a non-linear fit to determine the parameters that may characterize the plasma. By characterizing the plasma, the engineer may be able to determine how a recipe may be adjusted in order to minimize substandard processing of the substrates.

Unfortunately, the prior art method of analyzing the data for each RF burst may require several seconds or as much as several minutes to complete. Since there are typically thousands, if not millions of RF bursts to analyze, the total time for characterizing the plasma for a recipe may take hours to calculate. As a result, the prior art method is not an effective method in providing timely relevant data for process control purposes.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, the PIF probe method may be employed to collect data about the plasma that may be positioned within the reactor chamber environment. Data collected from a sensor (e.g., PIF probe) may be employed to characterize the plasma in the reactor chamber. Additionally, since the sensor employs a collection surface as shown in FIG. 5, data about the chamber surface may also be determined. In the prior art, the data collected by the PSD probe provides a ready source of data that is available for analysis. Unfortunately, the sheer volume of data that may be collected has made analyzing the data in a timely manner a challenge. Since thousands or even millions of data points may be collected, the task of identifying the relevant interval in order to accurately characterize a plasma may be a daunting task, especially since the data is usually being analyzed manually. As a result, the data collected has not been useful in providing the plasma processing system with a timely characterization of the plasma.

However, if relevant data points that are needed in order to characterize a plasma are identified from the thousands/millions of data points that may be collected, then the time required to characterize a plasma may be significantly reduced. In accordance with embodiments of the invention, a method is provided for automatically characterizing plasma in a relatively short time period. Embodiments of the invention described herein provide for an algorithm for identifying the relevancy range in order to reduce the data points that may need to be analyzed in order to characterize a plasma. As discussed herein, the relevancy range refers to a smaller set of data points from the thousands or millions of data points that may be gathered between each RF burst. Embodiments of the invention further provide for estimating seed values that may be applied to a mathematical model that calculates the values for characterizing a plasma. By performing curve-fitting to the relevancy range, parameters that may be employed to characterize a plasma may be calculated.

The features and advantages of the present invention may be better understood with reference to the figures and discussions that follow.

Figure 9:
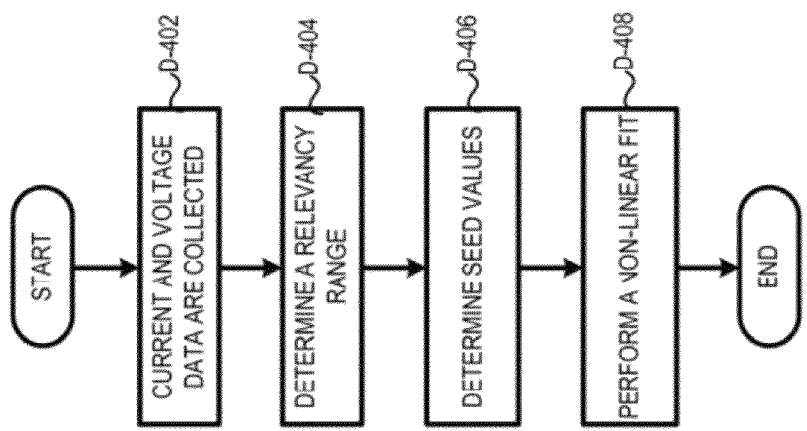
FIG. 9 of the DISCUSSION shows, in an embodiment of the invention, a simple flow chart illustrating the overall steps for automatically characterizing plasma during substrate processing.

FIG. 9 shows, in an embodiment of the invention, a simple flow chart illustrating the steps for automatically characterizing plasma during substrate processing. Consider the situation wherein, an RF charge has been provided during substrate processing.

At a first step D-402, current and voltage data are collected. In an example, after the RF source has been turned on, an RF charge (pulse) is provided. After the RF charge has been turn off, a current sensor and a voltage sensor may be employed to collect data at a probe, such as a planar ion flux probe, which may be mounted to a chamber wall of the reactor chamber. As aforementioned, the number of data points that may be collected by the sensors may range in the thousands or millions. In some cases, thousands to ten of thousands of data points may be collected between each RF burst making near-real-time analysis in the prior art nearly impossible.

In the prior art, several hours may be allotted for analyzing the measurement data that is collected during semiconductor substrate processing. In one aspect of the invention, the inventors herein realized that the measurement data between each RF burst does not have to be analyzed in order to characterize a plasma. Instead, if curve-fitting is applied to a relevancy range of the data set, parameters that may be employed to characterize the plasma may be determined.

At a next step D-404, a relevancy range is determined. As aforementioned, the relevancy range refers to a subset of the data set that has been collected between each RF burst. In the prior art, since the data is being manually analyzed, the sheer volume of the data collected make calculating the relevancy range a challenging task. In many instances, the relevancy range may be visually estimated. In identifying the relevancy range, noises that may exist may be substantially eliminated from the subset of data set. In an example, during complex substrate processing, a polymer buildup may occur on the probe, causing a portion of the data collected to be skewed. For example, the portion of the data that may be impacted tends to be the data that may be collected once the capacitor has been fully discharged. In identifying the relevancy range, data associated with the polymer buildup may be removed from the analysis. In other words, the determination of the relevancy range may enable plasma characterization to occur without being subject to random noises. Discussion about how a relevancy range may be determined, for an example, is provided later in the discussion of FIG. 10.

In addition to identifying the relevancy range, the seed values may also be determined, at a next step D-406. As discussed herein, the seed values refer to the estimated value of the slope, the electron temperature, the ion saturation value, the floating voltage potential, and the like. Discussion about how the seed values may be estimated, for example, is provided in the discussion of FIG. 10.

The relevance range and the seed values are utilized to perform curve-fitting. Since curve-fitting has to be performed before the next RF burst, the methods employed to determine the relevancy range and/or seed values have to utilize minimum overhead and produce values that are close to the final fit values, thereby reducing number of curve-fitting iterations that may be required in order to achieve a rapid convergence.

With the relevancy range and the seed values, at a next step D-408, a non-linear fit (e.g., curve-fitting) may be performed, thereby enabling the plasma to be characterized within a shorter time period without requiring an expensive high-end computer. Unlike the prior art, the method allows for results from a decay interval due to a single RF burst to be characterized in approximately 20 milliseconds instead of requiring a few minutes or even a few hours to process. With near-realtime analysis capability, the method may be applied as part of an automatic control system to provide the engineer with relevant data during plasma processing.

Figure 10:
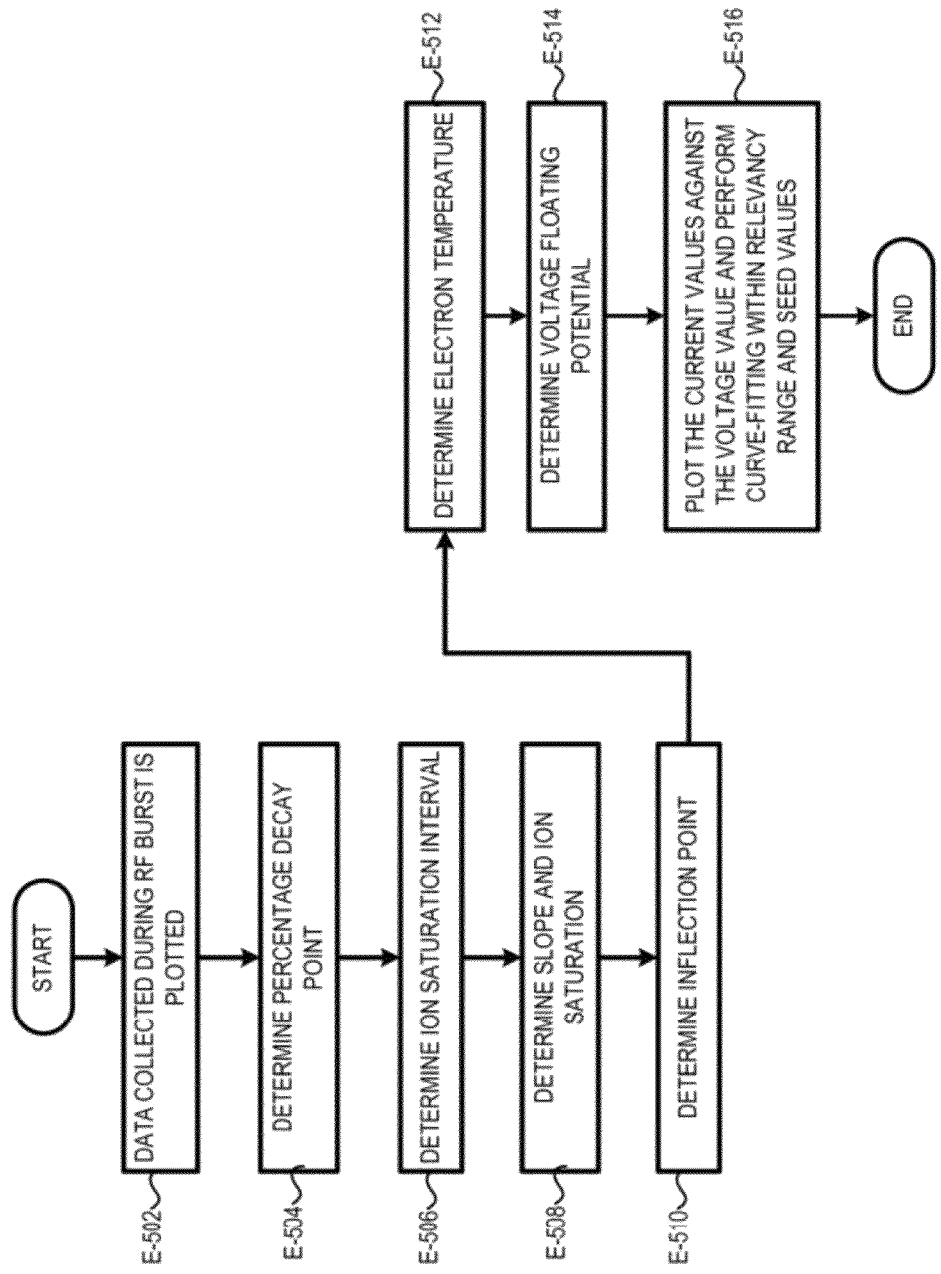
FIG. 10 of the DISCUSSION shows, in an embodiment of the invention, a simple algorithm for determining the relevancy range and the seed values.

FIG. 10 shows, in an embodiment of the invention, a simple algorithm for determining the relevancy range and the seed values. FIG. 10 will be discussed in relation to FIGS. 11, 12, 13, and 14.

At a first step E-502, the data collected during each RF burst is automatically plotted. In an example, the current data that may be collected by the current sensor is plotted into a current versus time graph F1-600, such as the one shown in FIG. 11. In another example, the voltage data collected may be plotted into a voltage versus time graph F2-650, as shown in FIG. 12. Although the data may produce similar graphs as the prior art, unlike the prior art, the data collected is automatically fed into the analysis program without requiring human intervention. Alternatively, the measurement data collected does not have to be plotted. Instead, the data may be fed directly into the analysis program. Instead, the graphs are provided as visual examples to explain the algorithm.

Unlike the prior art, the entire data set is not analyzed in order to characterize a plasma. Instead, a relevancy range is determined. To determine the relevancy range, a percentage decay point may first be determined, at a next step E-504. As discussed herein, the percentage decay point refers to the data point at which the original value has decayed to a certain percentage of the original value. In an embodiment, the percentage decay point may represent the end of the data interval to be analyzed. In an example, when the RF source is switched off, the current value, is about 0.86 mA/cm². The value is represented by a data point F1-602 on graph F1-600 of FIG. 11. If the percentage decay point is set to ten percent of the original value, the percent decay point is at data point F1-604, which is about 0.086 mA/cm². In other words, the percentage decay point may be determined by applying a pre-defined percentage to the original value, which is value of the electrical charge when the RF source is switched off and the system is returning to an equilibrium state. In an embodiment, the percentage is empirically determined. In an embodiment, instead of employing a percentage decay point to determine the end of the data interval, the peak of a first derivative of the data collected for each RF burst may be calculated.

At a next step E-506, the algorithm may determine the ion saturation interval, which is the data subset between the original value and a second decay point. As discussed herein, the ion saturation interval refers to the region of the current-voltage (IV) curve at which the probe potential is sufficiently negative with respect to the floating potential such that the electron flux to the probe is negligible. In this region the current to the probe increases slowly and linearly with increasingly negative potential. In addition, the ion saturation interval is the regime at which the bias voltage is sufficiently negative with respect to the floating potential such that the probe will collect all the available ions in the system. In other words, the collected current "saturates" as the bias voltage is raised sufficiently high. Also, as discussed herein, the "available ions" refers to the flux of ions impinging upon the sheath boundary, which may enlarge as the bias voltage is further increased.

Figure 11:
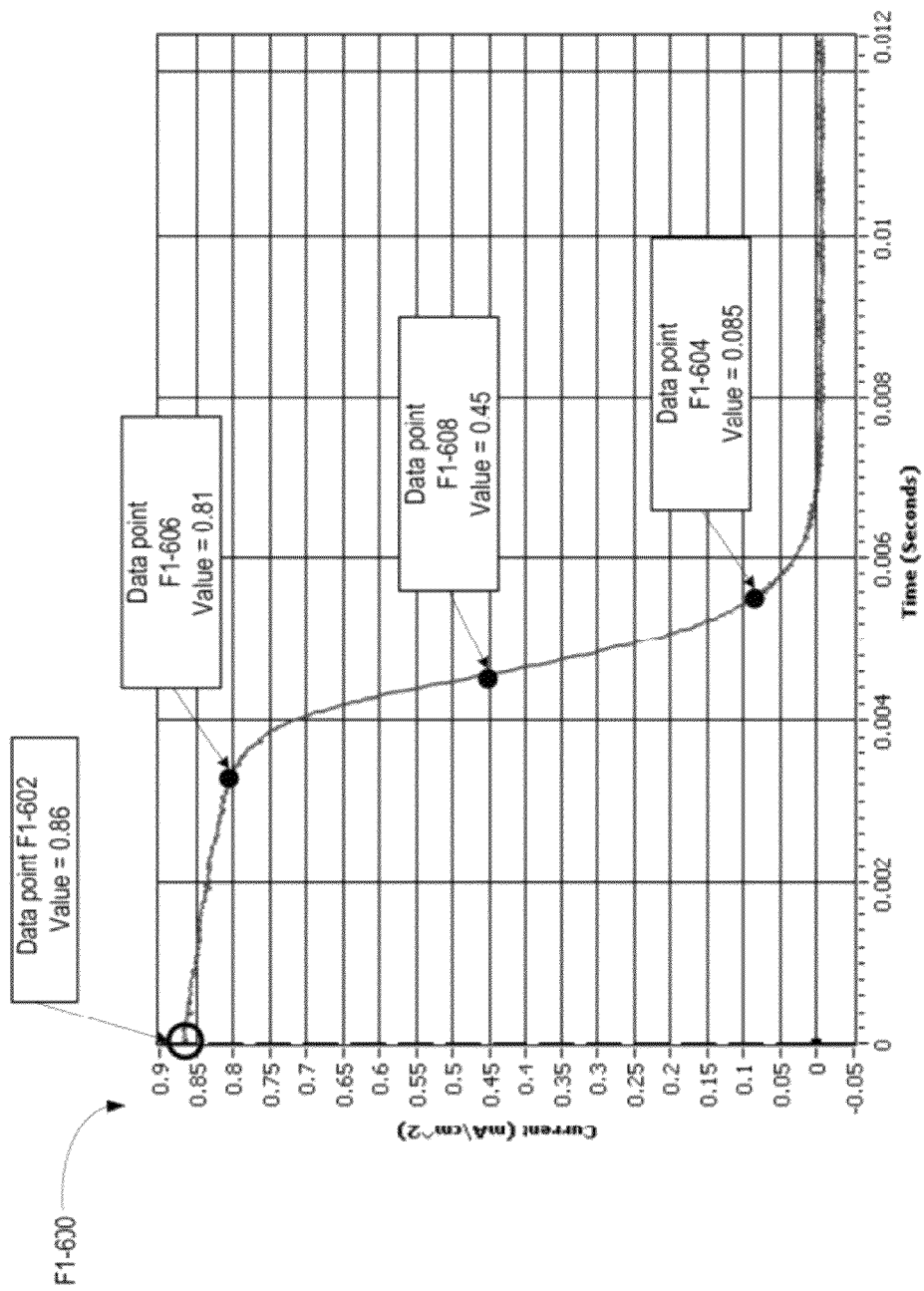
FIG. 11 of the DISCUSSION shows an example of current versus time after a RF burst.
Figure 12:
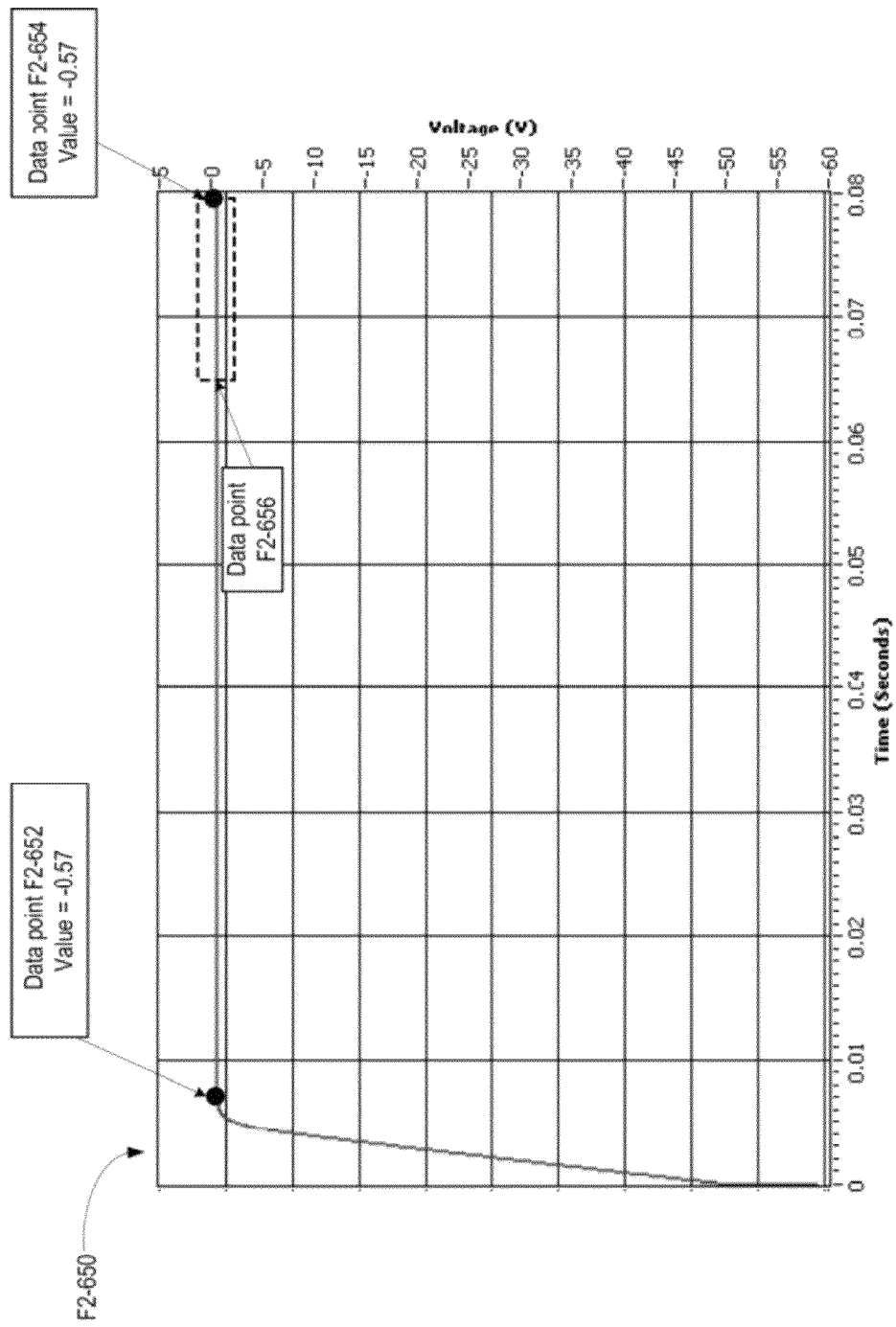
FIG. 12 of the DISCUSSION shows an example of voltage versus time after a RF burst.

In other words, the ion saturation interval is the interval from data points F1-602 and F1-606 of FIG. 11. In an embodiment, the second decay point may be determined by taking a percentage of the original value (i.e., data point F1-602). In an example, if the second decay point is about 95 percent of the original value, the second decay point is about 0.81 mA/cm² (i.e., data point F1-606). Hence, the ion saturation interval is from the original value (data point F1-602) to the second decay point (data point F1-606). Note that the second decay point is between the original value (data point F1-602) and the percentage decay point (data point F1-604). Similar to the percentage decay point, the second decay point may also be based on a pre-defined threshold, in an embodiment. In an embodiment, the percentage is empirically determined.

Once the ion saturation interval has been determined, at a next step E-508, the slope (s) and the ion saturation ($i_0$) may be estimated. As aforementioned, the slope (s) and the ion saturation ($i_0$) are two of the four seed values that may be applied to a mathematical model (Equation 2 below) to determine the parameters that characterize a plasma. In an example, the slope (s) may be determined by performing linear regression. In another embodiment, the algorithm may also determine the ion saturation ($i_0$) by taking the average of the data values between data points F1-602 and F1-606.

Figure 13:
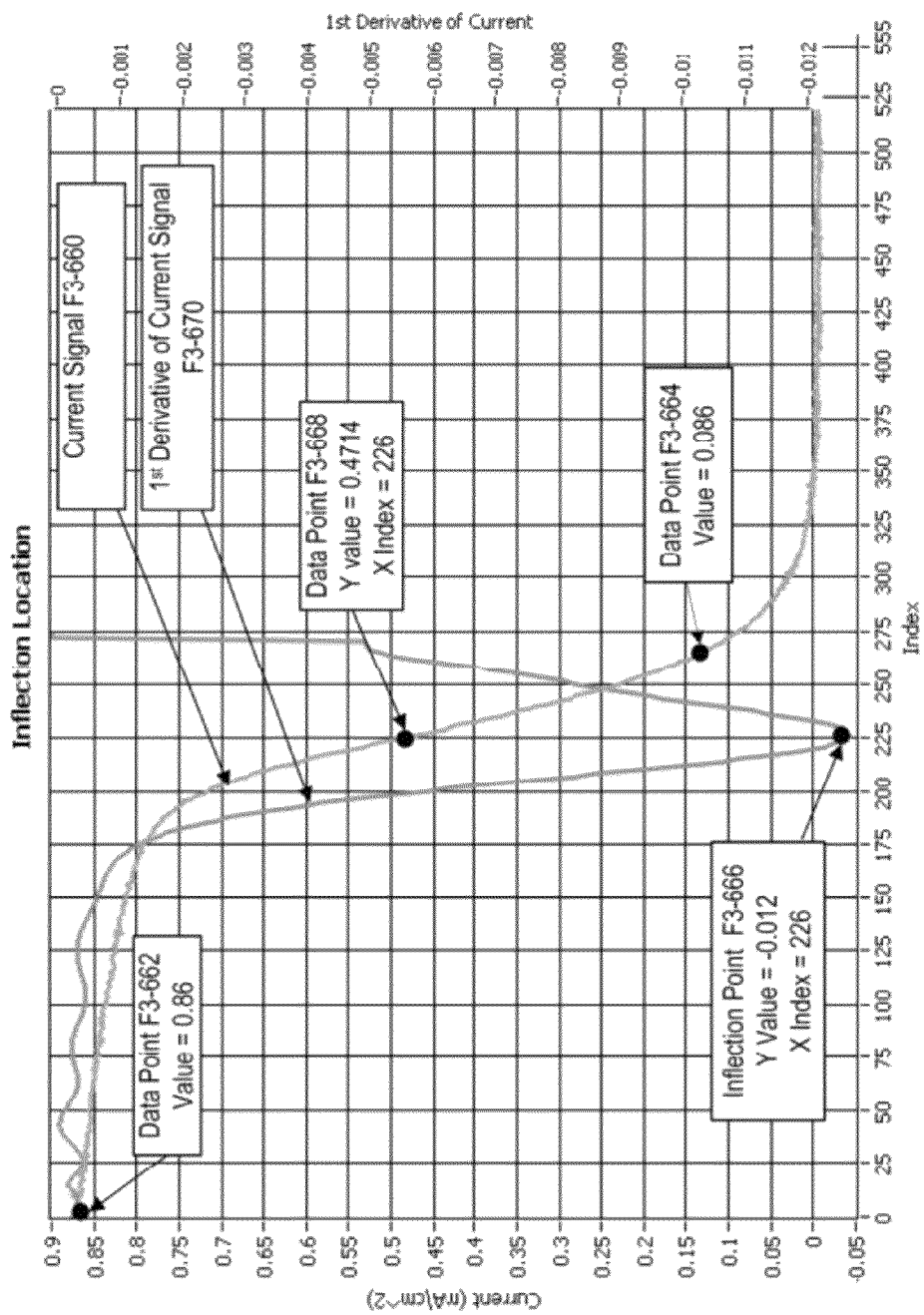
FIG. 13 of the DISCUSSION shows an example of an inflection point.

At a next step E-510, the algorithm may determine the inflection point, which is the point at which the first derivative changes sign. In an embodiment, the inflection point may be calculated by identifying the minimal value of the first derivative of the current values between the percentage decay point and the second decay point. To illustrate, FIG. 13 shows the first derivative of the values between a percentage decay point (F3-664) and an original point (F3-662) of a current signal F3-660. The inflection point is the minimal data point of the first derivative (F3-670), which has a value of −0.012 mA/cm² and an index value of 226 (as shown by data point F3-666). To determine the inflection value, the index value is mapped to current signal plot F3-660. In this example, when the index value of the first derivative is mapped to current signal F3-660, the inflection value is 0.4714 mA/cm², as shown by data point F3-668.

In an embodiment, the relevancy range is defined as the range between the original value and the inflection point. Additionally or alternatively, a percent decay threshold may be set (e.g., at 35 percent) instead of calculating the inflection point. In an example, using the percent decay point of 35 percent, which may be empirically determined, the relevancy range may fall between points F1-602 and F1-604 of FIG. 11.

$$T_e = \text{abs}\left(\frac{I_{meas}(t)}{\left(\frac{dI_{meas}}{dV_{meas}}\right)}\right) = \text{abs}\left(\frac{I_{meas}(t)}{\left(\frac{dI_{meas}}{dt}\right)\left(\frac{dt}{dV_{meas}(t)}\right)}\right) \quad \text{[Equation 1]}$$

TABLE 1

Parameters defined

| Parameters | Variable name |
|---|---|
| $I_{meas}$ | Current measured |
| $V_{meas}$ | Voltage measured |
| t | Current time |
| $T_e$ | Electron temperature |

With the inflection point identified, the electron temperature may be estimated, at a next step E-512. The electron temperature may be estimated by employing Equation 1 above. The current and voltage data utilized to calculate the electron temperature is within the transition interval, which is usually when a probe is drawing less current than the ion saturation current. In an embodiment, the time at which the current and voltage data is measured may correspond with the inflection point. Alternatively, the inflection point of the current-voltage (I-V) curve may also be employed. Since the electron temperature is a ratio of a first derivative (as determined in calculating the percentage decay point) of the data collected for an RF burst at a time corresponding to the inflection point on the current-voltage curve, the computational overhead that may be required to generate the number is minimal.

At a next step E-514, the algorithm may determine the floating voltage potential. Since the floating voltage potential is determined based on the voltage data collected, the floating voltage potential may be determined without first having to determine the values as calculated in steps E-504-E-512. Those skilled in the art are aware that floating voltage potential is the electrical potential at which the probe floats after the external capacitor has fully discharged. Typically, the floating voltage potential may be determined by looking at the signal that occurs right before the next RF burst. However, due to the possibility of polymer buildup causing distortion, erroneous data (i.e., noise) may be collected; thus, the floating voltage potential may be calculated by averaging the voltage values collected toward the end of the collection period. In an embodiment, the floating voltage potential may be calculated from data point F2-652 (the data point at which the voltage first reaches its floating potential) to data point F2-654 (the data point just right before the next RF burst), as shown in FIG. 12. In another embodiment, the floating voltage potential may be based on the voltage values within a window F2-656, which is located between data points F2-652 and F2-654, as shown in FIG. 12. In an embodiment, window F2-656 may be of any size as long as the window begins before the prior pulse has decayed more than 99 percent and ends when the next pulse begins. In one embodiment, the floating voltage potential may be determined from a window that provides an average value with a low standard deviation (error).

As can be appreciated from the foregoing, the methods for determining the relevancy range and the seed values account for anomalies that may occur in the current, voltage and/or current-voltage (I-V) curves. In an example, polymer buildup may occur at the end of an RF burst. However, by applying the aforementioned algorithms, the relevancy range and the seed values are impervious to unexpected artifacts that may occur during processing.

Figure 14:
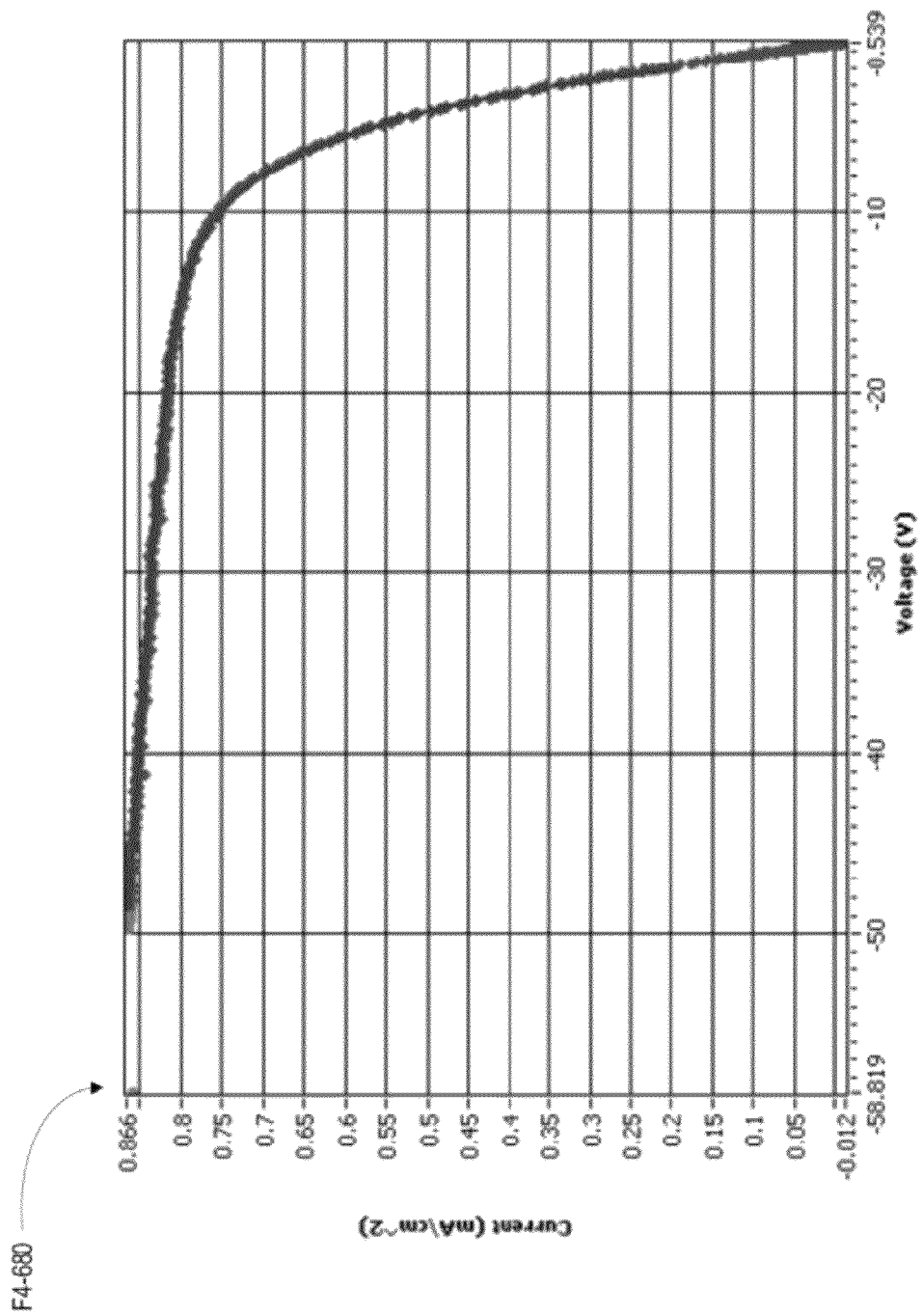
FIG. 14 of the DISCUSSION shows an example of a curve-fitting applied to a current versus voltage graph.

Once the relevancy range has been determined and the seed values have been calculated, at a next step E-516, the current values may be plotted against the voltage values and curve-fitting may be applied to generate graph F4-680 of FIG. 14. In an example, a non-linear curve fit, such as Levenberg-Marquardt algorithm, may be applied to perform the curve-fitting. By generating a curve-fitting graph and applying the seed values to the mathematical model, such as Equation 2 below, the four parameters that may be employed to characterize the plasma may be determined.

$$I = I_0 \left\{ 1 - s*(V - V_f) - \exp\left[\frac{(V - V_f)}{T_e}\right] \right\} \quad \text{[Equation 2]}$$

TABLE 2

Parameters defined

| Parameters | Variable name |
|---|---|
| I | Current |
| $I_0$ | Ion saturation |
| S | Slope |
| V | Voltage |
| $V_f$ | Floating voltage potential |
| $T_e$ | Electron temperature |

As can be appreciated from one or more embodiments of the present invention, an automated method for characterizing plasma during plasma processing is provided. By determining a relevancy range and a set of seed values, plasma characterization may occur without having to process thousands or millions of data points that are usually collected after a single RF burst. The automated method transforms a previously tedious and manual process into an automatic task that may be performed quickly and efficiently. With data analysis significantly shortened from a few minutes (or even a few hours) to a few milliseconds, plasma characterization may be performed during plasma processing instead of being a post-production process. Thus, relevant data may provide insights into the current plasma environment, thereby enabling recipe and/or tool adjustment to occur and waste to be minimized.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. Also, it is intended that the following appended claims be interpreted as including all such alterations, permutations, and equivalents as fall within the true spirit and scope of the present invention.

What is claimed is:

1. A processing system for detecting in-situ arcing events during substrate processing, comprising:
    at least a plasma processing chamber having a probe arrangement, wherein said probe arrangement is disposed on a surface of said processing chamber and is configured to measure at least one plasma processing parameter, wherein said probe arrangement includes
        a plasma-facing sensor, and
        a measuring capacitor, wherein said plasma-facing sensor is coupled to a first plate of said measuring capacitor; and
    a detection arrangement, said detection arrangement is coupled to a second plate of said measuring capacitor, wherein said detection arrangement is configured for converting an induced current flowing through said measuring capacitor into a set of digital signals, said set of digital signals being processed to detect said in-situ arcing events.

2. The processing system of claim 1 wherein said plasma-facing sensor is disposed in an upper electrode.

3. The processing system of claim 1 wherein said plasma-facing sensor is disposed on a chamber wall of said processing chamber.

4. The processing system of claim 1 wherein said plasma-facing sensor is made of a conductive material.

5. The processing system of claim 1 wherein said plasma-facing sensor is a capacitively-coupled electrostatic (CCE) probe head.

6. The processing system of claim 1 wherein said detection arrangement includes
    a current-to-voltage converter, wherein said current-to-voltage converter is configured for at least converting said induced current flowing through said probe arrangement into a set of analog voltage signals,
    an analog-to-digital converter configured for at least converting said set of analog voltage signals into said set of digital signals, and
    a signal processor, wherein said signal processor is configured for at least processing said set of digital signals to detect high frequency perturbations, said high frequency perturbations indicating said in-situ arcing events.

7. The processing system of claim 6 wherein said high frequency perturbations have amplitude excursions in both a positive direction and a negative direction.

8. The processing system of claim 1 further including a tool control circuit, wherein said tool control circuit is configured for receiving a message from said detection arrangement when said in-situ arcing events are detected, said tool control circuit is configured to apply correction actions to fix said in-situ arcing events.

9. The processing system of claim 1 further including a voltage measurement device coupled to said first plate of said measuring capacitor, wherein said voltage measurement device being configured for at least collecting voltage measurements and for measuring potential change of said plasma-facing sensor.

10. The processing system of claim 9 wherein voltage measurements collected by said voltage measurement device is converted to a digital signal for signal processing to detect said in-situ arcing events.

11. A processing system for detecting in-situ arcing events within a processing chamber during substrate processing, comprising:
   means for collecting a set of process data, said process data including induced current signals flowing through a measuring capacitor;
   means for converting said induced current signals into a set of analog voltage signals;
   means for converting said set of analog voltage signals into a set of digital signals; and
   means for analyzing said set of digital signals to detect high frequency perturbations, said high frequency perturbations indicating said in-situ arcing events.

12. The processing system of claim 11 further includes means for comparing a rate of change of said induced current signals to a pre-defined threshold, wherein said in-situ arcing events exist if said rate of change is outside of said pre-defined threshold.

13. The processing system of claim 12 further includes means for sending a message to a tool controller circuit when said in-situ arcing events are detected, said tool control circuit is configured to apply correction actions to fix said in-situ arcing events.

14. The processing system of claim 11 further includes means for measuring voltage signals from a plasma-facing sensor to determine potential change during substrate processing.

15. The processing system of claim 14 further includes converting said measured voltage signals into digital signals.

16. The processing system of claim 15 further includes analyzing said digital signals to detect said high frequency perturbations, wherein said high frequency perturbations indicating said in-situ arcing events.

17. The processing system of claim 16 further includes comparing a rate of change of said voltage signals to a pre-defined threshold, wherein said in-situ arcing events exist if said rate of change is outside of said pre-defined threshold.

18. The processing system of claim 11 further includes means for applying a set of periodic radio frequency (RF) pulse trains to said measuring capacitor and measuring current decay signals of said measuring capacitor.

19. The processing system of claim 18 further includes applying an arc detection algorithm to detect said high frequency perturbations above a pre-defined threshold on said measuring capacitor's current decay signals.

20. The processing system of claim 19 further includes comparing a rate of change of said current decay signals to a pre-defined threshold, wherein said in-situ arcing events exist if said rate of change is outside of said pre-defined threshold.

\* \* \* \* \*